(12) United States Patent
Straub et al.

(10) Patent No.: US 8,792,198 B1
(45) Date of Patent: Jul. 29, 2014

(54) HIGH IMPEDANCE LOW NOISE CROSS-COUPLED AMPLIFIER FOR USE IN AS A PREAMPLIFIER IN A MAGNETIC DATA STORAGE SYSTEM

(71) Applicant: LSI Corporation, San Jose, CA (US)

(72) Inventors: Michael Straub, Longmont, CO (US); Andrew P. Krebs, Eagan, MN (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 14/141,682

(22) Filed: Dec. 27, 2013

Related U.S. Application Data

(60) Provisional application No. 61/907,469, filed on Nov. 22, 2013.

(51) Int. Cl.
*G11B 5/09* (2006.01)
(52) U.S. Cl.
USPC .............................................. 360/46; 360/67

(58) Field of Classification Search
None
See application file for complete search history.

(56) References Cited

U.S. PATENT DOCUMENTS

| 4,742,308 | A  | 5/1988  | Banu |
| 6,831,799 | B2 | 12/2004 | Pakriswamy et al. |
| 7,259,624 | B2 | 8/2007  | Barnett |
| 7,362,530 | B2 | 4/2008  | Hashizume |

*Primary Examiner* — Paul Huber

(57) ABSTRACT

A balanced amplifier with a relatively high input impedance with wide bandwidth for use as a fly-height sensor head preamplifier in a magnetic storage read system. The balanced amplifier has two substantially identical halves, each amplifier half having an input transistor, responsive to the input node of the amplifier half disposed in series with a cross-coupling transistor receiving a buffered cross-coupled version of the input signal applied to the other half of the balanced amplifier. Use of cascoded transistors and voltage-followers to limit voltages across various the input and cross-coupling transistors enhance the common mode rejection and power supply rejection ratios of the amplifier while retaining a low high-frequency noise figure similar to low-input impedance balanced amplifier designs.

18 Claims, 3 Drawing Sheets

HIGH IMPEDANCE LOW NOISE CROSS-COUPLED AMPLIFIER FOR USE IN AS A PREAMPLIFIER IN A MAGNETIC DATA STORAGE SYSTEM

BACKGROUND

1. Field of the Invention

The present invention relates to magnetic data storage systems generally and, more specifically, to low noise balanced preamplifiers useful for read and control channels in magnetic storage systems.

2. Description of the Related Art

A popular method of magnetic data storage utilizes magnetoresistive (MR) heads to store and recover data on a magnetic data storage medium such as a magnetic disk. An MR head employs an MR element that changes in resistivity with changing magnetic flux from data patterns on an adjacent magnetic disk surface. A bias current having a constant value is passed through the MR element, and the change in resistivity is measured by sensing the change in voltage across the MR head.

Preamplifier circuits that sense signals directly from a MR head commonly include differential inputs and differential outputs. A preamplifier is typically embodied in an integrated circuit, possibly with other preamplifiers and other circuitry such as write drivers, and is collocated with, or is positioned very near, the MR head. While there are a wide variety of balanced amplifier circuit topologies, most include an input stage driving two load resistors and symmetrical transistors for splitting current between the load resistors to generate an amplified output signal. Usually, the output signal is a differential voltage taken as the difference in the voltage drops across the load resistors; in this manner, large variations in output voltages may be achieved with extremely small input voltage differentials.

New magnetic storage technologies require sensing how high the MR head is above the rotating magnetic disk (referred to herein as fly-height control) in addition to reading data from the disk. To do so, multiple control systems are connected to a fly-height sensing head, co-located with the MR head, to read how high the head is from the magnetic disk media during the reading of information therefrom. Previously the frequency bands of two of the control systems, referred to as DC sense and thermal asperity (TA) sense, did not overlap so interaction between the DC and TA sense systems was typically not a factor. However, new magnetic storage systems utilize overlapping frequency bands for fly-height control. Existing preamplifier designs have too low an input impedance to permit connecting the two sense paths to the same sense head because the frequency response of the preamplifier is not sufficiently flat over the bandwidth of the signals being amplified by the preamplifier. Thus, a new preamplifier design is desired to provide a substantially flat frequency response over the overlapping frequency bands of the DC and TA sense systems.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment of the invention, a balanced amplifier circuit for amplifying an input signal and for providing an output signal is disclosed. The balanced amplifier comprises first and second input signal nodes, first and second amplifier circuits, and first and second coupling circuits. The first amplifier circuit has an input transistor and a cross-coupling transistor, the input transistor having a control terminal connected to the first input signal node, a first output terminal coupled to a first output terminal of the cross-coupling transistor, and a second output terminal coupled to a first power supply node. The second amplifier circuit has an input transistor and a cross-coupling transistor, the input transistor having a control terminal connected to the first input signal node, a first output terminal coupled to a first output terminal of the cross-coupling transistor, and a second output terminal coupled to the first voltage node. The first coupling circuit including a capacitor and a coupling transistor, the first coupling circuit being connected such that a control terminal of the coupling transistor is connected to the first input signal node and the capacitor is connected between a first output terminal of the coupling transistor and a control terminal of the cross-coupling transistor of the second amplifier circuit. The second coupling circuit including a capacitor and a coupling transistor, the second coupling circuit being connected such that a control terminal of the coupling transistor is connected to the second input signal node and the capacitor is connected between a first output terminal of the coupling transistor and a control terminal of the cross-coupling transistor of the first amplifier circuit.

BRIEF DESCRIPTION OF THE DRAWINGS

Other embodiments of the present invention will become more fully apparent from the following detailed description, the appended claims, and the accompanying drawings in which like reference numerals identify similar or identical elements.

DETAILED DESCRIPTION

The following patent is incorporated herein in its entirety: U.S. Pat. No. 6,831,799, titled "High Bandwidth Low Noise Cross-Coupled Amplifier", by Elango Pakriswamy et al.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

Also for purposes of this description, the terms "couple", "coupling", "coupled", "connect", "connecting", or "connected" refer to any manner known in the art or later developed in which energy is allowed to transfer between two or more elements, and the interposition of one or more additional elements is contemplated, although not required. Conversely, the terms "directly coupled", "directly connected", etc., imply the absence of such additional elements. Signals and corresponding nodes or ports might be referred to by the same name and are interchangeable for purposes here. The term "or" should be interpreted as inclusive unless stated otherwise.

The present invention will be described herein in the context of illustrative embodiments of a balanced, low noise amplifier, adapted for use in as a control channel preamplifier for a magnetic mass storage device or the like. It is to be appreciated, however, that the invention is not limited to the specific apparatus and methods illustratively shown and described herein.

Figure 1:
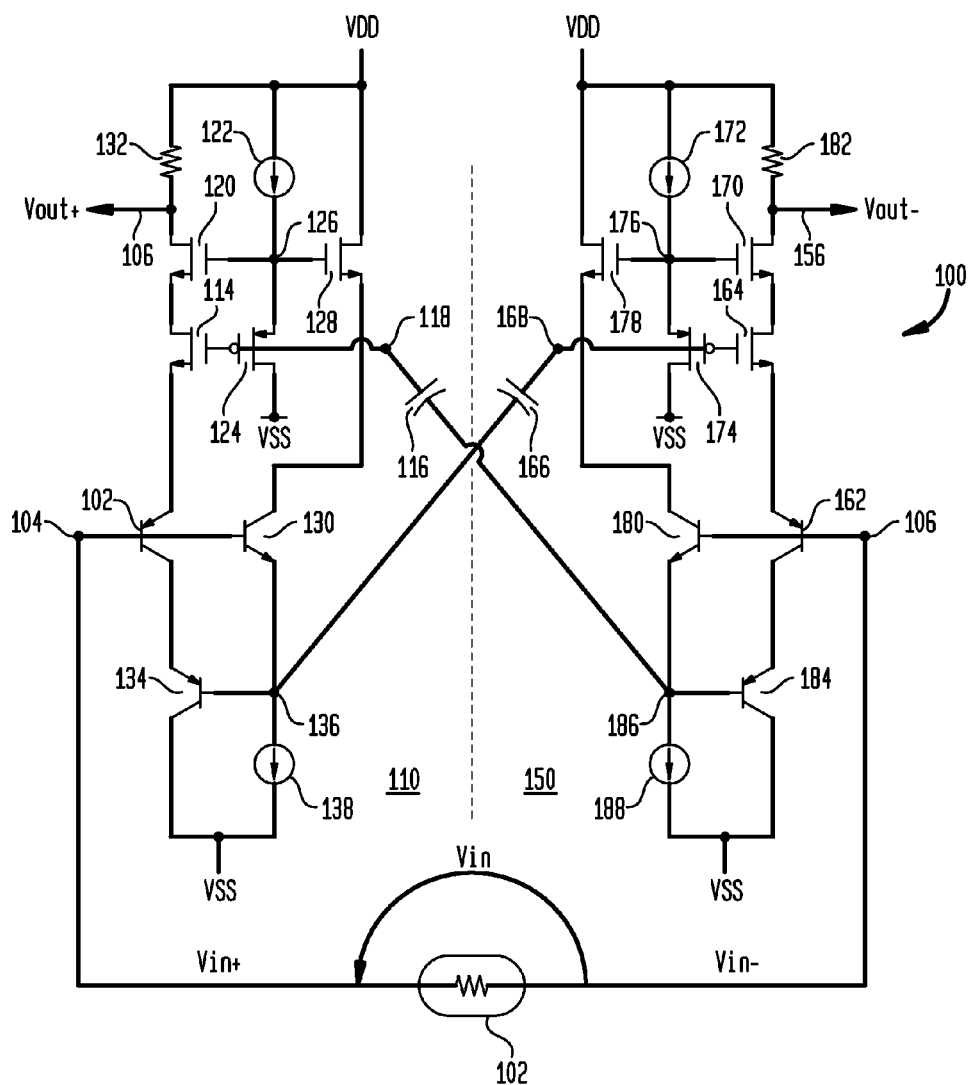
FIG. 1 is a simplified schematic diagram of a balanced amplifier having two halves, according to an embodiment of the invention.

FIG. 1 is a simplified schematic diagram of a balanced amplifier 100 according to an embodiment of the invention. In one embodiment, the amplifier 100 is used as a preamplifier to amplify signals from a high-temperature coefficient resistive fly-height sense head 102 as part of a larger magnetic mass storage unit such as a disk drive. However, it is understood that the balanced amplifier 100 might have uses besides in magnetic storage systems or the like. The input signals Vin+ and Vin− form a differential input signal from the head 102 to the amplifier 100 and output signals Vout+, Vout− form a differential output signal from the amplifier 100. The amplifier 100 comprises two substantially identical amplifier halves 110, 150, each having an input node 104, 154 and an output node 106, 156. Each amplifier half utilizes a bipolar PNP input transistor 112, 162 coupled to each input to provide a high input impedance for the amplifier 100 such that multiple amplifiers (not shown) might be placed in parallel with the head 102. In an alternative embodiment, the PNP transistors 112 and 162 are P-channel metal-oxide-semiconductor field-effect transistors (PMOS).

Further description of amplifier half 110 is given herein with the understanding that that description applies equally to amplifier half 150 and with similar reference numbers (e.g., 114 and 164, 126 and 176, etc.). For simplicity, the various current sources shown in the figures are idealized current sources, e.g., have essentially infinite output impedance and require no headroom. Actual current sources, either variable or constant, have a finite output impedance but the finite output impedance does not significantly affect the operation of the amplifier 100 as described herein.

N-channel metal-oxide-semiconductor field-effect transistor (NMOS) 114 receives cross-coupled signals via capacitor 116 at node 118 and operates in cascode with NMOS 120. Current source 122 and P-channel metal-oxide-semiconductor field-effect transistor (PMOS) 124 serves as a bias circuit to provide a bias voltage on node 126 and to the gates of cascode NMOS 120 and NMOS 128. NMOS 128 supplies a stabilized voltage to voltage-follower NPN transistor 130. As explained below, NPN transistor 130 acts as a buffer between signals applied to input 104 and cross-coupling capacitor 166. The PMOS 124 is a source or voltage-follower setting the bias voltage for the NMOS devices 120, 126 to follow a bias voltage on node 118. It might be desirable to have the voltage on the gate of NMOS 120 track the gate voltage of NMOS 114 to provide a substantially constant drain-to-source voltage for NMOS 114 to improve the performance of the cascode and, thus, the overall common-mode rejection ratio (CMRR) of the amplifier 100. The NMOS 128 holds a substantially constant collector-to-base voltage for the NPN voltage-follower 130, also improving the CMRR of the amplifier 100. Output from the amplifier half 110 on node 106 is developed across load resistance 132 disposed between output node 106 and a positive voltage supply rail $V_{DD}$.

The collector of PNP input transistor 112 is coupled to the emitter of optional voltage-follower PNP transistor 134. Because the base of the PNP transistor 134 is coupled to the emitter of voltage-follower NPN transistor 130 at node 136, the collector-to-base voltage of PNP transistor 112 is substantially constant, thereby improving the CMRR and the power supply rejection ratio (PSRR) of the amplifier 100. Current source 138 sinks enough current for NPN transistor 130 to operate while also drawing enough bias current for PNP transistor 134 to operate. It is understood that PNP transistor 134 might be removed and the collector of the PNP transistor 112 connected to $V_{SS}$. In an alternative embodiment, a load (not shown), such as a resistor or a current mirror, is coupled in series with the collector of PNP transistor 134, if present, or, if not, the collector of the PNP transistor 112, and ground to provide an alternative output from the amplifier half 110.

A cross-coupled signal from amplifier half 110 is coupled to amplifier half 150 by a coupling circuit of capacitor 116 and NPN transistor 130 configured as a voltage-follower. The NPN voltage-follower 130 provides the cross-coupled signal for amplifier half 150 at node 136 by buffering input signals on input node 104. NPN transistor 130 also reduces the capacitive loading of the input 104 compared to having the capacitor 116 connected to the input node 104, thereby increasing the bandwidth of the amplifier 100 and decreasing high frequency noise produced by the amplifier 100. This is because NPN transistor 130 is connected as an emitter or voltage-follower and provides an emitter-base capacitance that, when connected in series with capacitor 116, reduces the net capacitance between input node 104 and transistors 164, 174. Device 130 also increases the voltage across capacitor 166, moving the operating point of the capacitor 166 into a region having a smaller voltage-dependent capacitance coefficient, thereby further improving CMRR.

Figure 2:
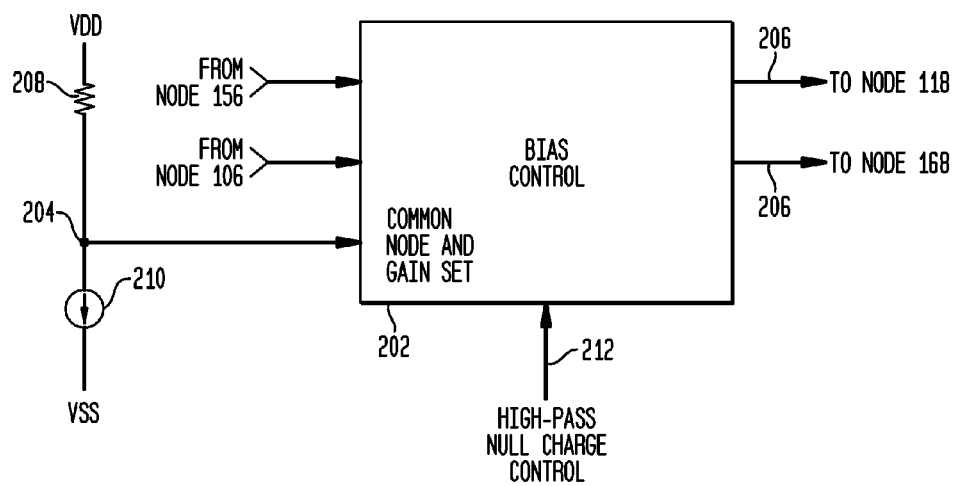
FIG. 2 is a bias circuit for the balanced amplifier of FIG. 1.

Common mode control, bias, and bandwidth control of the amplifier 100 are provided by bias control circuit 200 in FIG. 2. The bias control circuit 200 is typically integrated into a substrate in common with the amplifier 100 so that variations in operating temperature and manufacturing processes impact the bias circuit and amplifier substantially equally. A bias control block 202, responsive to Vout+ and Vout− on nodes 106 and 156, respectively, charges or discharges the capacitors 116, 166 to control the gain of the amplifier 100 and the output voltages Vout+, Vout−. The bias control block 202, in response to a common mode and gain control signal at node 204, varies a bias voltage applied to nodes 118, 168 from outputs 206 to force the average drop across resistors 132 and 182 (FIG. 1) to be approximately equal to the voltage across resistor 208. This also sets the overall gain of the amplifier 100. The voltage drop across resistor 208 is controlled by variable current source 210. In one embodiment, the current passed by current source 210 is temperature compensated so that the gain of the amplifier 100 does not vary significantly with changes in operating temperature or process variation.

The bias control block 202 also controls the differential voltage of the outputs Vout+, Vout−. Here, the block 202 performs a high-pass nulling of offsets in the amplifier 100 by receiving Vout+ and Vout− and, in response to control signal 212 and a low-frequency signal (not shown) applied to the input nodes 104, 106 of amplifier 100 (Vin), the charge on the two capacitors 116, 166 is adjusted until the differential voltage of the outputs Vout+, Vout− is approximately zero.

Figure 3:
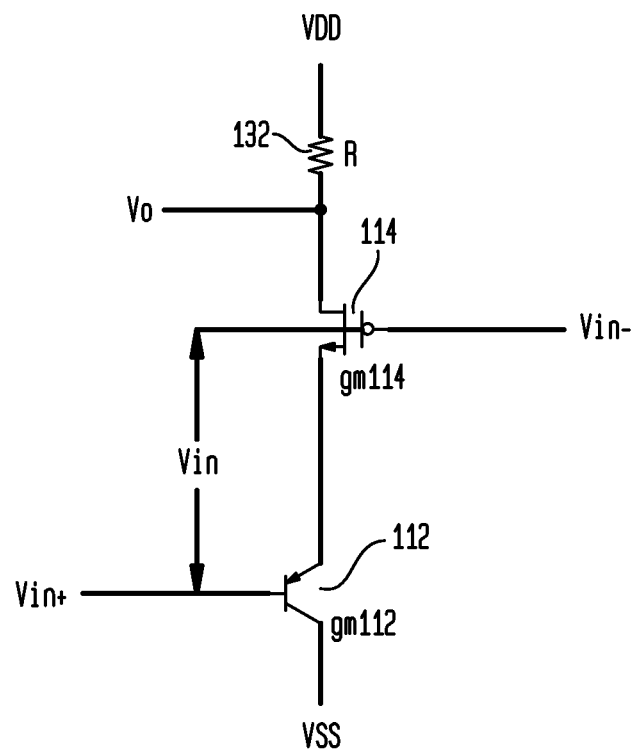
FIG. 3 is a greatly simplified schematic diagram of one of the amplifier halves shown in FIG. 1 for purposes of analyzing of the operation of the balanced amplifier of FIG. 1.

Because of the balanced nature of the amplifier 100 and the use of inverted cross-coupled signals via capacitors 116, 166, the amplifier 100 provides an overall gain substantially defined by a combination of the transconductances (gm) of the PNP input transistors 112, 162 and NMOS transistors 114, 164. This is illustrated in FIG. 3, a simplified circuit diagram of amplifier half 110 (FIG. 1) to illustrate how the amplifier 100 operates. Assuming that the voltage-follower NPN transistor 180 in amplifier half 150 (FIG. 1) is "perfect" (i.e., the voltage at node 186 exactly tracks the voltage on input node 106), the overall gain of the amplifier in FIG. 3 at mid-band (input signals having frequencies above the high-pass frequency substantially determined by the control signal 212 but low enough that the effects of inter-electrode capacitance of the various transistors and that of capacitor 116 can be ignored), and recognizing that Vin+ and Vin− in FIGS. 1 and 3 form a differential signal having a differential amplitude of Vi, is defined as the ratio of the output signal Vo to the differential input signal Vi and is approximately:

$$\frac{Vo}{Vin} = -\frac{R\ gm112\ gm114}{gm112 + gm114};$$

where gm112 is the transconductance of the PNP transistor 112 and gm114 is the transconductance of NMOS transistor 114, and R is the resistance of load resistor 132. Thus, for the full amplifier 100 in FIG. 1, the differential gain A is approximately:

$$\frac{Vout}{Vin} = A = -\frac{2R\ gm112\ gm114}{gm112 + gm114}.$$

In another embodiment of the invention, the NMOS devices 114, 120, and 128 are replaced with NPN transistors and the bias circuitry of current source 122 and PMOS 124 replaced or modified to provide suitable bias currents as is well known in the art. Similarly, the polarity of the transistors can be interchanged, e.g., PNP transistors substituted for NPN transistors, PMOS for NMOS transistors, etc., with suitable change in bias and supply voltage polarities.

Therefore, the present invention provides, inter alia, a preamplifier for a magnetic storage read system that has higher input impedance than prior art designs but retains the bandwidth and low high-frequency noise figure advantages of the prior art designs by using, in each amplifier half, an input transistor responsive to the input node of the amplifier half and disposed in series with a cross-coupling transistor receiving a buffered version of the input signal applied to the other half of the amplifier. Cascode transistors and voltage-follower transistors limit voltages applied to the input and cross-coupling transistors to enhance the common mode rejection and power supply rejection ratios of the amplifier.

It will be further understood that various changes in the details, materials, and arrangements of the parts that have been described and illustrated in order to explain the nature of this invention may be made by those skilled in the art without departing from the scope of the invention as expressed in the following claims.

The invention claimed is:

1. A balanced amplifier circuit for amplifying an input signal and for providing an output signal, the balanced amplifier circuit comprising:
first and second input signal nodes;
a first amplifier circuit including an input transistor and a cross-coupling transistor, the input transistor having a control terminal connected to the first input signal node, a first output terminal coupled to a first output terminal of the cross-coupling transistor, and a second output terminal coupled to a first power supply node;
a second amplifier circuit including an input transistor and a cross-coupling transistor, the input transistor having a control terminal connected to the first input signal node, a first output terminal coupled to a first output terminal of the cross-coupling transistor, and a second output terminal coupled to the first power supply node;
a first coupling circuit including a capacitor and a coupling transistor, the first coupling circuit being connected such that a control terminal of the coupling transistor is connected to the first input signal node and the capacitor is connected between a first output terminal of the coupling transistor and a control terminal of the cross-coupling transistor of the second amplifier circuit; and
a second coupling circuit including a capacitor and a coupling transistor, the second coupling circuit being connected such that a control terminal of the coupling transistor is connected to the second input signal node and the capacitor is connected between a first output terminal of the coupling transistor and a control terminal of the cross-coupling transistor of the first amplifier circuit.

2. The balanced amplifier of claim 1 wherein the first amplifier further comprises a load resistor coupled between a second output terminal of the cross-coupling transistor and a second power supply node; and wherein the second amplifier further comprises a load resistor coupled between a second output terminal of the cross-coupling transistor and the second power supply node.

3. The balanced amplifier of claim 2 wherein the first amplifier further comprises a cascode device having a control terminal, a first output terminal connected to the second output terminal of the cross-coupling transistor, and a second output terminal connected to the load resistor; and wherein the second amplifier further comprises a cascode device having a control terminal, a first output terminal connected to the second output terminal of the cross-coupling transistor, and a second output terminal connected to the load resistor.

4. The balanced amplifier of claim 1 wherein the first coupling circuit further comprises: a voltage-follower having a control terminal connected to a second output terminal of the coupling transistor in the first coupling circuit, a first output terminal connected to the second output terminal of the input transistor in the first amplifier circuit, and a second output terminal connected to the first power supply node; and wherein the second coupling circuit further comprises: a voltage-follower having a control terminal connected to a second output terminal of the coupling transistor in the second coupling circuit, a first output terminal connected to the second output terminal of the input transistor in the second amplifier circuit, and a second output terminal connected to the first power supply node.

5. The balanced amplifier of claim 1 wherein the first coupling circuit further comprises a current source coupled between the first output terminal of the coupling transistor and the first power supply node, and the second coupling circuit further comprises a current source coupled between the first output terminal of the coupling transistor and the first power supply node.

6. The balanced amplifier of claim 4 wherein, for both of the first and second amplifiers, the second output terminal of the input transistor is a collector of a bipolar transistor of a first conductivity type, the first output terminal of the cross-coupling transistor is a source terminal of an metal-oxide-semiconductor transistor, and the first output terminal of the voltage-follower is an emitter of a bipolar transistor of the first conductivity type; and wherein, for both of the first and second coupling circuits, the first output terminal of the coupling transistor is an emitter of a bipolar transistor of a second conductivity type different from the first conductivity type.

7. The balanced amplifier of claim 3 wherein the first amplifier circuit further comprises a voltage-follower having a control terminal connected to the control terminal of the cascode transistor, a first output terminal connected to a second output terminal of the coupling transistor the first coupling circuit, and a second output terminal coupled to the second power supply node; and wherein the second amplifier circuit further comprises a voltage-follower having a control terminal connected to the control terminal of the cascode transistor, a first output terminal connected to a second output terminal of the coupling transistor of the second coupling circuit, and a second output terminal coupled to the second power supply node.

8. The balanced amplifier of claim 3 wherein the first amplifier further comprises a current source coupled between the second power supply node and the control terminal of the cascode transistor, and a bias transistor having a control terminal connected to the control terminal of the cross-coupling transistor, a first output terminal connected to the control terminal of the cascode transistor, and a second control terminal coupled to the first power supply voltage node; and wherein the second amplifier further comprises a current source coupled between the second power supply node and the control terminal of the cascode transistor, and a bias transistor having a control terminal connected to the control terminal of the cross-coupling transistor, a first output terminal connected to the control terminal of the cascode transistor, and a second control terminal coupled to the first power supply voltage node.

9. The balanced amplifier of claim 8 wherein, for both the first and second amplifiers, the cascode transistor and the cross-coupling transistor are metal-oxide-semiconductor transistors of a first conductivity type, and the bias transistor is a metal-oxide-semiconductor transistor of a second conductivity type different from the first conductivity type.

10. A read system for reading information from a magnetic storage medium comprising:
 a high-temperature coefficient resistive fly-height sense head having two terminals; and
 a balanced amplifier in accordance with claim 1;
 wherein each of the read head terminals are coupled to a respective one of the first and second input signal nodes of the balanced amplifier.

11. The read system of claim 10 further comprising:
 an additional balanced amplifier in accordance with claim 1;
 wherein each of the read head terminals are also coupled to a respective one of the first and second input signal nodes of the additional balanced amplifier.

12. The apparatus of claim 1 wherein, for both the first and second amplifiers, a second load is coupled between the second output terminal of the input transistor and the first power supply node.

13. An apparatus comprising:
 first and second input signal nodes;
 a high-temperature coefficient resistive fly-height sense head coupled between the first and second input nodes;
 a first amplifier circuit including an input transistor, a load resistor, a cascode transistor, and a cross-coupling transistor, the input transistor having a control terminal connected to the first input signal node, a first output terminal coupled to a first output terminal of the cross-coupling transistor, the cascode transistor having an input terminal, a first output terminal coupled to a second output terminal of the cross-coupling transistor, and the load resistor coupled between a second output terminal of the cascode transistor and a second power supply node;
 a second amplifier circuit including an input transistor, a load resistor, a cascode transistor, and a cross-coupling transistor, the input transistor having a control terminal connected to the first input signal node, a first output terminal coupled to a first output terminal of the cross-coupling transistor, the cascode transistor having a control terminal, a first output terminal coupled to a second output terminal of the cross-coupling transistor, and the load resistor coupled between a second output terminal of the cascode transistor and the second power supply node;
 a first coupling circuit including a capacitor, a current source, a voltage-follower, and a coupling transistor, the first coupling circuit being connected such that a control terminal of the coupling transistor is connected to the first input signal node, a control terminal of the voltage-follower is connected to a first output terminal of the coupling transistor, a first output terminal of the voltage follower coupling to the second output terminal of the input transistor in the first amplifier, the capacitor is connected between the first output terminal of the coupling transistor and a control terminal of the cross-coupling transistor of the second amplifier circuit, and the current source is connected between the first output terminal of the coupling transistor and the first voltage source node; and
 a second coupling circuit including a capacitor, a current source, a voltage-follower, and a coupling transistor, the second coupling circuit being connected such that a control terminal of the coupling transistor is connected to the second input signal node, a control terminal of the voltage-follower is connected to a first output terminal of the coupling transistor, a first output terminal of the voltage follower coupling to the second output terminal of the input transistor in the second amplifier circuit, the capacitor is connected between the first output terminal of the coupling transistor and a control terminal of the cross-coupling transistor of the first amplifier circuit, and the current source is connected between the first output terminal of the coupling transistor and the first voltage source node.

14. The apparatus of claim 13 wherein, for both of the first and second amplifier circuits, the first output terminal of the input transistor being a collector of a bipolar transistor of a first conductivity type, the first output terminal of the cross-coupling transistor is a source terminal of an metal-oxide-semiconductor transistor, and the first output terminal of the voltage-follower is an emitter of a bipolar transistor of the first conductivity type; and wherein, for each of the coupling circuit, the first output terminal of the coupling transistor is an emitter of a bipolar transistor of a second conductivity type different from the first conductivity type.

15. The apparatus of claim 13 wherein the first amplifier circuit further comprises a voltage-follower having a control terminal connected to the control terminal of the cascode transistor, a first output terminal connected to a second output terminal of the coupling transistor of the first coupling circuit, and a second output terminal coupled to the second power supply node; and wherein the second amplifier circuit further comprises a voltage-follower having a control terminal connected to the control terminal of the cascode transistor, a first output terminal connected to a second output terminal of the coupling transistor of the second coupling circuit, and a second output terminal coupled to the second power supply node.

16. The apparatus of claim 13 wherein the first amplifier further comprises a current source connected between the second power supply node and the control terminal of the cascode transistor, and a bias transistor having a control terminal connected to the control terminal of the cross-coupling transistor, a first output terminal connected to the control terminal of the cascode transistor, and a second control terminal coupled to the first power supply voltage node; and wherein the second amplifier further comprises a current source connected between the second power supply node and the control terminal of the cascode transistor, and a bias transistor having a control terminal connected to the control terminal of the cross-coupling transistor, a first output terminal connected to the control terminal of the cascode transistor, and a second control terminal coupled to the first power supply voltage node.

17. The apparatus of claim 16 wherein, for both the first and second amplifiers, the cascode transistor and the cross-coupling transistor are metal-oxide-semiconductor transistors of a first conductivity type, and the bias transistor is a metal-oxide-semiconductor transistor of a second conductivity type different from the first conductivity type.

18. The apparatus of claim 13 wherein, for both the first and second amplifiers, a second load is coupled between a second output terminal of the input transistor and the first power supply node.

* * * * *